(12) United States Patent
Sakai et al.

(10) Patent No.: US 10,847,723 B2
(45) Date of Patent: Nov. 24, 2020

(54) DROPLET DISCHARGE METHOD, PROGRAM, MANUFACTURING METHOD OF ORGANIC EL DEVICE, FORMING METHOD OF COLOR FILTER

(71) Applicant: TOKYO ELECTRON LIMITED, Tokyo (JP)

(72) Inventors: Hirofumi Sakai, Shiojiri (JP); Kiyomi Oshima, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 304 days.

(21) Appl. No.: 15/240,541

(22) Filed: Aug. 18, 2016

(65) Prior Publication Data

US 2017/0062719 A1    Mar. 2, 2017

(30) Foreign Application Priority Data

Aug. 26, 2015    (JP) ................................. 2015-166483

(51) Int. Cl.
| | | |
|---|---|---|
| *H01L 51/00* | (2006.01) | |
| *B41J 2/01* | (2006.01) | |
| *G02B 5/20* | (2006.01) | |
| *H01L 27/32* | (2006.01) | |
| *H01L 51/50* | (2006.01) | |

(52) U.S. Cl.
CPC ............ *H01L 51/0005* (2013.01); *B41J 2/01* (2013.01); *G02B 5/201* (2013.01); *H01L 27/322* (2013.01); *H01L 51/0012* (2013.01); *H01L 51/5012* (2013.01)

(58) Field of Classification Search
CPC ...... H01L 51/0005; H01L 27/322; B41J 2/01; B41J 2/015; B41J 29/38; G02B 5/201; B05D 1/26; H05B 33/10
See application file for complete search history.

(56) References Cited

U.S. PATENT DOCUMENTS

| | | | |
|---|---|---|---|
| 2005/0008770 A1 | 1/2005 | Kawase | |
| 2005/0078377 A1* | 4/2005 | Li ..................... | B29D 11/00278 359/619 |
| 2006/0152559 A1* | 7/2006 | Sakai ..................... | G02B 5/201 347/84 |
| 2006/0290764 A1* | 12/2006 | Nagae ................. | H01L 51/0005 347/107 |
| 2008/0143936 A1* | 6/2008 | Wang ................ | G02F 1/133514 349/109 |
| 2008/0317941 A1 | 12/2008 | Hanaoka | |

(Continued)

FOREIGN PATENT DOCUMENTS

| | | |
|---|---|---|
| CN | 1883821 A | 12/2006 |
| CN | 102726122 A | 10/2012 |

(Continued)

*Primary Examiner* — Francisco W Tschen

(74) *Attorney, Agent, or Firm* — Abelman, Frayne & Schwab

(57) ABSTRACT

A droplet discharge method includes a region setting step of setting one end portion of a landing region of an opening at a predetermined distance from an end portion of the opening on an opening side which is adjacent to the opening in an X-axis direction, and a discharging step of causing a base and a discharge head to face and relatively scan each other, and causing at least one droplet to land in the landing region from a nozzle of the discharge head.

19 Claims, 10 Drawing Sheets

(56) References Cited

U.S. PATENT DOCUMENTS

| | | | |
|---|---|---|---|
| 2010/0066877 A1* | 3/2010 | Yamaguchi | H01L 27/14603 348/279 |
| 2011/0215336 A1 | 9/2011 | Onodera et al. | |
| 2012/0299033 A1* | 11/2012 | Goda | H01L 27/3283 257/89 |
| 2013/0277663 A1* | 10/2013 | Nanno | H01L 51/0005 257/40 |

FOREIGN PATENT DOCUMENTS

| | | |
|---|---|---|
| JP | 2004-109209 A | 4/2004 |
| JP | 2004-361428 A | 12/2004 |
| JP | 2004-361491 A | 12/2004 |
| JP | 2009-000618 A | 1/2009 |
| JP | 2011-187492 A | 9/2011 |
| JP | 2011-189267 A | 9/2011 |
| JP | 2013-172060 A | 9/2013 |

* cited by examiner

DROPLET DISCHARGE METHOD, PROGRAM, MANUFACTURING METHOD OF ORGANIC EL DEVICE, FORMING METHOD OF COLOR FILTER

BACKGROUND

1. Technical Field

The present invention relates to a droplet discharge method, a program for realizing a droplet discharge method, a manufacturing method of organic EL device using a droplet discharge method, and a forming method of a color filter.

2. Related Art

A droplet discharge method (alternatively, also referred to as an ink jet method) is known in which an inkjet head capable of discharging a liquid as a droplet is used so as to form a functional layer including a luminous layer disposed in pixels of an organic electroluminescent (EL) device or a colored layer of a color filter used for a liquid display device, for example.

In the droplet discharge method used in forming the functional layer or the colored layer, it is necessary to form a coated film having a desired film thickness by surrounding a region for forming the coated film with a partition wall and by reliably delivering the droplet discharged from the ink jet head to the region surrounded with the partition wall.

For example, JP-A-2004-361491 discloses a manufacturing method of a color filter substrate in which the droplet is discharged from a nozzle of the ink jet head so that the center of the droplet lands in a range within approximately 30% of a distance from the center of a display dot region to an edge of the nearest display dot region.

If this manufacturing method of the color filter substrate is employed, the landed droplet is less likely to enter the adjacent region over a bank (partition wall). Accordingly, it is possible to prevent color mixture from occurring between filter elements (colored layers) having different colors.

For example, JP-A-2011-189267 discloses a manufacturing method of a pattern film forming member including a droplet landing region setting process, in which a first landing prohibited region on a side in a moving direction of a droplet discharge head and a second landing prohibited region on the opposite side in the moving direction of the droplet discharge head are set for a landing permitted region of the droplet within a pattern film forming region partitioned by a partition portion, and in which the first landing prohibited region is set to be wider than the second landing prohibited region.

If this manufacturing method of the pattern film forming member is employed, when the droplet is discharged from the nozzle of the droplet discharge head, even if a tailing portion or a satellite (minute droplet) which follows a main droplet of the droplet lands late, the droplet can be accommodated in the pattern film forming region which is a landing target. That is, functional liquids coating the adjacent pattern film forming regions do not come into contact with each other. Accordingly, it is possible to minimize poor color mixture.

However, if pixels in the organic EL device or the liquid crystal display device become high definition, the film forming region surrounded with the bank (partition portion) becomes narrowed. Consequently, the droplet is less likely to land accurately. In the moving direction of the droplet discharge head, if a width of the bank (partition portion) which partitions the adjacent film forming regions becomes narrowed, even if the landing region or the landing prohibited region of the droplet is set as disclosed in JP-A-2004-361491 or JP-A-2011-189267, when the droplet lands the landing region, a shape of the droplet increases due to the inertial force. Therefore, the droplet enters the adjacent film forming region over the bank (partition portion), thereby causing a possibility that the film thickness of the pattern film may become uneven or the color of the pattern film may become uneven.

SUMMARY

An advantage of some aspects of the invention is to solve at least a part of the problems described above, and the invention can be implemented as the following aspects or application examples.

Application Example

A droplet discharge method according to an aspect of the invention includes, in a condition that, in a first direction on a base, a first opening and a second opening are adjacent to each other via a partition wall, and a third opening is adjacent to the second opening via the partition wall, a region setting step of setting one end portion of a landing region of the second opening at a predetermined distance L from an end portion of the third opening on the second opening side toward the second opening in the first direction, and setting the other end portion of the landing region of the second opening at the predetermined distance L from an end portion of the first opening on the second opening side toward the second opening in the first direction, and a discharging step of causing the base and a discharge head to face and relatively scan each other, and causing at least one droplet to land in the landing region from a nozzle of the discharge head.

In this application example, if the predetermined distance L is set in view of a landing diameter size after the droplet lands, the droplet landed in the landing region of the second opening in discharging the droplet does not leak to the first opening or the third opening in the first direction, and the second opening can be coated with the droplet. The predetermined distance L includes the width of the partition wall between the openings in the first direction. Accordingly, regardless of the width of the partition wall, the landing region of the second opening can be set. That is, even if the width of the partition wall becomes narrowed in the first direction, it is possible to set the landing region so as to prevent the landed droplet from leaking to the adjacent opening.

In the droplet discharge method according to the application example, it is preferable that, when, in the first direction, a width of the first opening is set to W1, a width of the second opening is set to W2, a width of the third opening is set to W3, a width of the partition wall between the first opening and the second opening is set to L1, and a width of the partition wall between the second opening and the third opening is set to L2, W1<W2≤W3 and L1>L2 are satisfied.

In the method with this configuration, even if the width L2 of the partition wall between the second opening and the third opening is set to be narrower than the width L1 of the partition wall between the first opening and the second opening, it is possible to provide the droplet discharge method in which the droplet landed in the landing region of the second opening is less likely to leak to the third opening whose width W3 is equal to or wider than the width W2 of the second opening, and is less likely to leak to the first opening whose width W1 is narrower than the width W2 of the second opening.

In the droplet discharge method according to the application example, it is preferable that the discharge head may have a plurality of nozzles, and in the discharging step, the discharge head is moved in a second direction and relatively scans the base which is disposed so that each longitudinal direction of the first opening, the second opening, and the third opening extends along the second direction orthogonal to the first direction, and a plurality of droplets are caused to land in the landing region from at least one nozzle of the plurality of nozzles.

In a so-called vertical drawing image on which the plurality of droplets are caused to land in the landing region from at least one nozzle in response to the scanning performed by relatively moving the plurality of nozzles in the second direction, in a case where the plurality of droplets continuously land although the case depends on a discharge interval in the second direction, the landing diameter formed by the plurality of droplets are more likely to increase, compared to the landing diameter of one droplet.

According to the method with the configuration described above, the predetermined distance L is set in view of the landing diameter of the droplet in the vertical drawing image. Therefore, it is possible to provide the droplet discharge method in which the droplets landed on the vertical drawing image are less likely to leak to the adjacent opening.

In the droplet discharge method according to the application example, it is preferable that the discharge head has a plurality of nozzles, and in the discharging step, the discharge head is moved in the first direction and relatively scans the base which is disposed so that each longitudinal direction of the first opening, the second opening, and the third opening extends along a second direction orthogonal to the first direction, and at least one droplet is caused to land in the landing region from two or more nozzles of the plurality of nozzles.

According to the method with this configuration, it is possible to provide the droplet discharge method in which the landed droplet is less likely to leak to the adjacent opening, even in so-called the vertical drawing image on which at least one droplet is caused to land in the landing region from each of two or more nozzles in response to the scanning performed by relatively moving the plurality of nozzles in the first direction.

In the droplet discharge method according to the application example, it is preferable that in single scanning for causing the base and the discharge head to face and relatively scan each other, the predetermined distance L is set to be greater than a value obtained by adding a landing position error of the droplet to a half value of the maximum diameter of the droplet landed in the landing region.

According to the method with this configuration, the droplet discharged from the nozzle of the discharge head can be reliably accommodated in the opening.

In the droplet discharge method according to the application example, it is preferable that in single scanning for causing the base and the discharge head to face and relatively scan each other, the predetermined distance L is set to be greater than a value obtained by adding a landing position error of the droplet to a half value of the maximum diameter of the droplet landed after the droplets whose number is the same as the number of droplets landed in the landing region are discharged onto the partition wall.

The droplet whose landing diameter increases after landing in the landing region rides on the partition wall in some cases. It is difficult to accurately measure the landing diameter in a state where the droplet rides on the partition wall. According to the method with the configuration described above, the predetermined distance L is set based on the maximum diameter in the droplet when the droplet lands on the partition wall. Therefore, it is possible to set the predetermined distance L by easily obtaining the maximum diameter.

In the droplet discharge method according to the application example, it is preferable that in the single scanning, a dummy droplet is caused to land on the partition wall so as to obtain the maximum diameter with reference to the center of the dummy droplet.

If the plurality of droplets landed in the landing region come into contact and are combined with each other, it is difficult to accurately identify a landing position.

According to the method with the configuration described above, the maximum diameter after the droplet lands in the landing region is obtained with reference to the center of the dummy droplet. Therefore, it is possible to easily obtain the maximum diameter.

In the droplet discharge method according to the application example, it is preferable that the landing region is set so that the center of the droplet landed in discharging the droplet includes the droplet located at one end portion and the other end portion of the landing region.

According to the method with this configuration, even if the plurality of droplets land so that the center of the droplet is located in one end portion and the other end portion of the landing region in the first direction of the opening, the droplet does not leak to another opening adjacent to the opening. Therefore, even if the width of the opening or the width of the partition wall between the openings becomes narrowed, the landing region can be secured.

Application Example

A program according to another aspect of the invention causes a computer to execute the droplet discharge method according to the above-described application example.

According to this application example, it is possible to provide the program in which the landing region can be set in the opening by the computer so as to prevent the droplet landed in the landing region of the opening from leaking to another opening adjacent to the opening in the first direction.

Application Example

A manufacturing method of an organic EL device according to still another aspect of the invention includes using the droplet discharge method according to the above-described application example, and discharging a droplet of a liquid for forming at least one layer within functional layers including a luminous layer in a plurality of openings which are adjacent to each other via a partition wall.

According to this application example, the droplet landed in the opening is less likely to leak to another opening adjacent to the opening in the first direction. Therefore, it is possible to form at least one layer within the functional layers in the opening by preventing uneven film thicknesses or uneven light emitting caused by the leaking droplet.

Application Example

A manufacturing method of a color filter according to yet another aspect of the invention includes using the droplet discharge method according to the above-described application example, and discharging a droplet of a liquid for forming a colored layer in a plurality of openings which are adjacent to each other via a partition wall.

According to this application example, the droplet landed in the opening is less likely to leak to another opening adjacent to the opening in the first direction. Therefore, it is possible to form the colored layer of the color filter in the opening by preventing uneven film thicknesses or uneven colors caused by the leaking droplet.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments for embodying the invention will be described with reference to the drawings. The drawings used herein are appropriately enlarged or reduced in order to illustrate elements described herein so as to be in a recognizable state.

First Embodiment

Droplet Discharge Device

Figure 1:
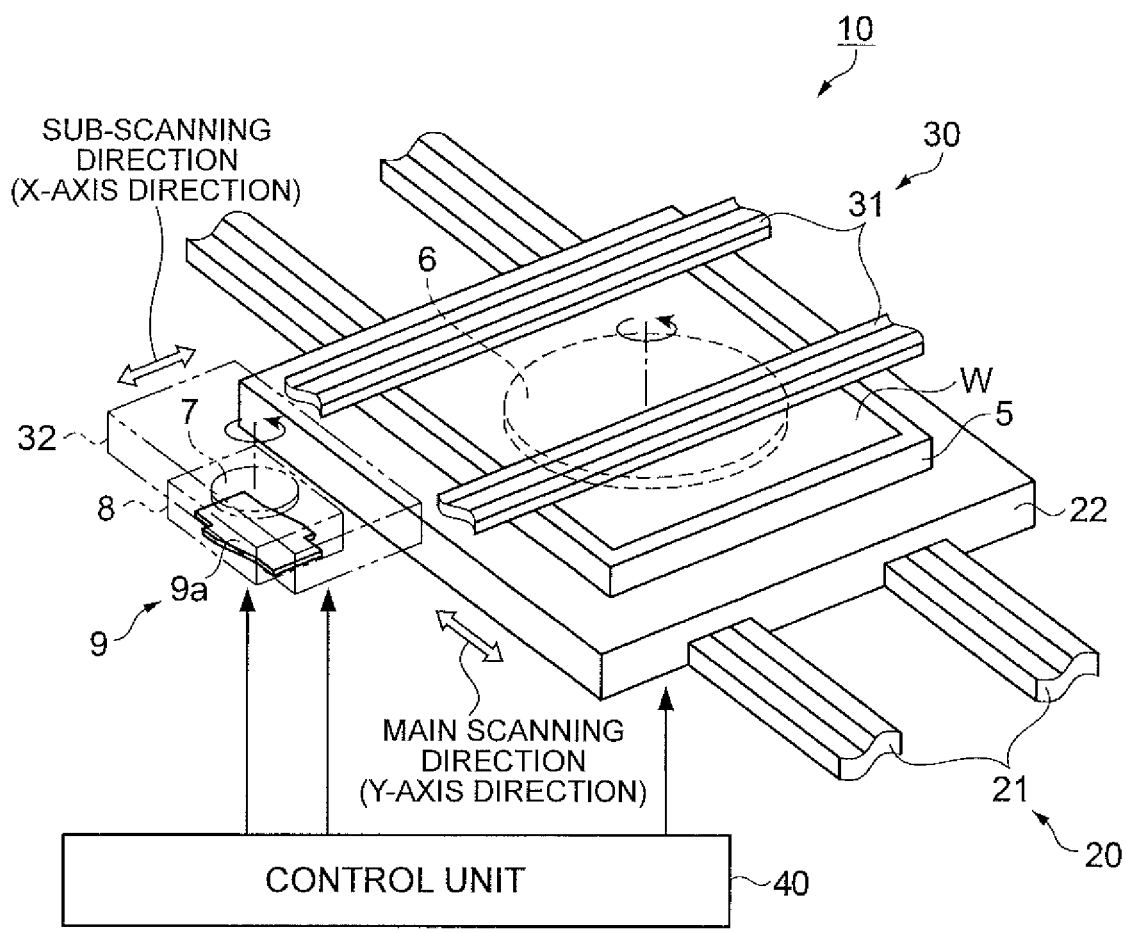
FIG. 1 is a schematic perspective view illustrating a configuration of a droplet discharge device.

First, an example of a droplet discharge device to which a droplet discharge method according to the present embodiment is applicable will be described with reference to FIGS. 1 to 5. FIG. 1 is a schematic perspective view illustrating a configuration of the droplet discharge device. A droplet discharge device 10 illustrated in FIG. 1 discharges a droplet of a liquid containing a functional layer forming material to a workpiece from a nozzle of a discharge head. The discharged liquid is dried, calcined, and solidified so as to form a functional layer in a predetermined region of the workpiece. A forming method of this functional layer is called the droplet discharge method in a liquid-phase process. An example of the functional layer formed using the droplet discharge method includes a colored layer of a color filter (to be described later) and a functional layer having a light emitting function of an organic EL element. The droplet discharge method according to the embodiment can be preferably employed for a case where this functional layer is formed using the droplet discharge device 10. The droplet discharge device 10 includes an ink jet head as the discharge head. The droplet discharge method using the ink jet head is also called an ink jet method.

As illustrated in FIG. 1, the droplet discharge device 10 includes a workpiece moving mechanism 20 which moves a flat-plate-shaped substrate W, for example, serving as the workpiece in a main scanning direction, and a head moving mechanism 30 which moves a head unit 9 having the ink jet head mounted thereon in a sub-scanning direction orthogonal to the main scanning direction. The droplet discharge device 10 further includes a control unit 40 which integrally controls all mechanisms (configurations) including mechanisms (configurations) which are not illustrated in FIG. 1. In the following description, in some cases, the main scanning direction is referred to as a Y-axis direction, and the sub-scanning direction is referred to as an X-axis direction.

The workpiece moving mechanism 20 includes a pair of guide rails 21, a moving carrier 22 which moves along the pair of guide rails 21, and a stage 5 which is disposed on the moving carrier 22 via the rotating mechanism 6 and on which the substrate W is mounted.

The stage 5 can adsorb and fix the substrate W, and can cause the rotating mechanism 6 to accurately align a reference axis of the substrate W in the main scanning direction (Y-axis direction) and the sub-scanning direction (X-axis direction).

The stage 5 can also rotate the substrate W, for example, as much as 90 degrees, in response to an arrangement of a film forming region to which the liquid (ink) is discharged on the substrate W.

The head moving mechanism 30 includes a pair of guide rails 31 and a moving carrier 32 which moves along the pair of guide rails 31. A carriage 8 suspended via the rotating mechanism 7 is disposed in the moving carrier 32.

The head unit 9 in which the ink jet head 50 (refer to FIG. 2) serving as the discharge head is mounted on a head plate 9a is attached to the carriage 8.

The moving carrier 32 moves the carriage 8 in the sub-scanning direction (X-axis direction), and disposes the head unit 9 so as to face the substrate W.

In addition to the above-described configuration, the droplet discharge device 10 has an ink supply mechanism for supplying the liquid (ink) to a plurality of ink jet heads 50 mounted on the head unit 9 or a maintenance mechanism for performing maintenance on the ink jet head 50.

Figure 2:
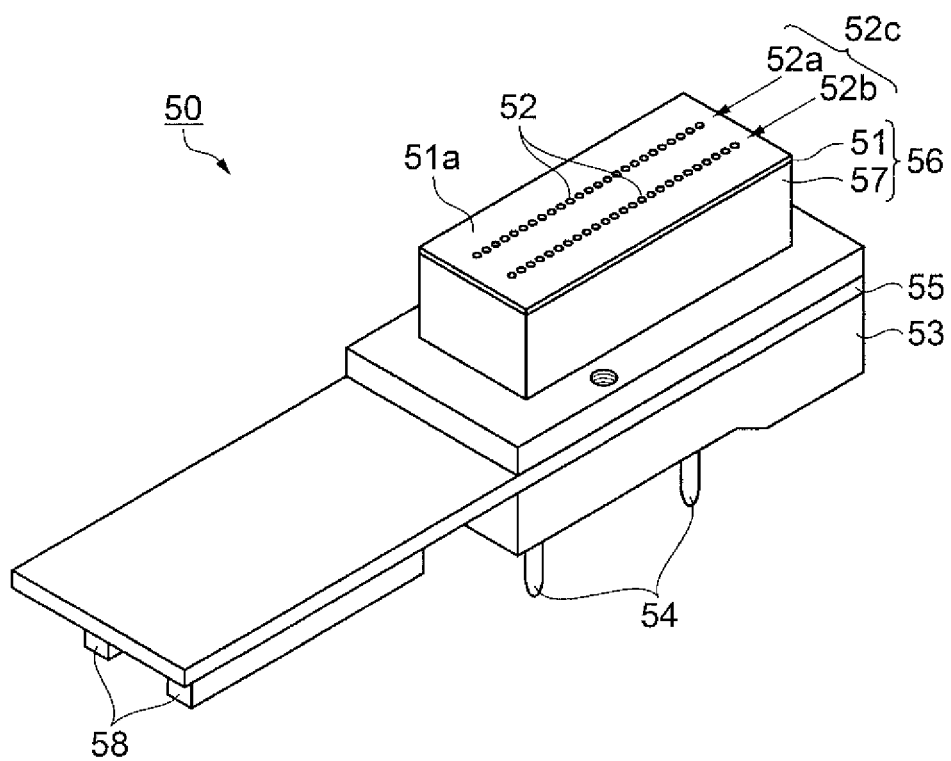
FIG. 2 is a schematic perspective view illustrating a configuration of an ink jet head.
Figure 3:
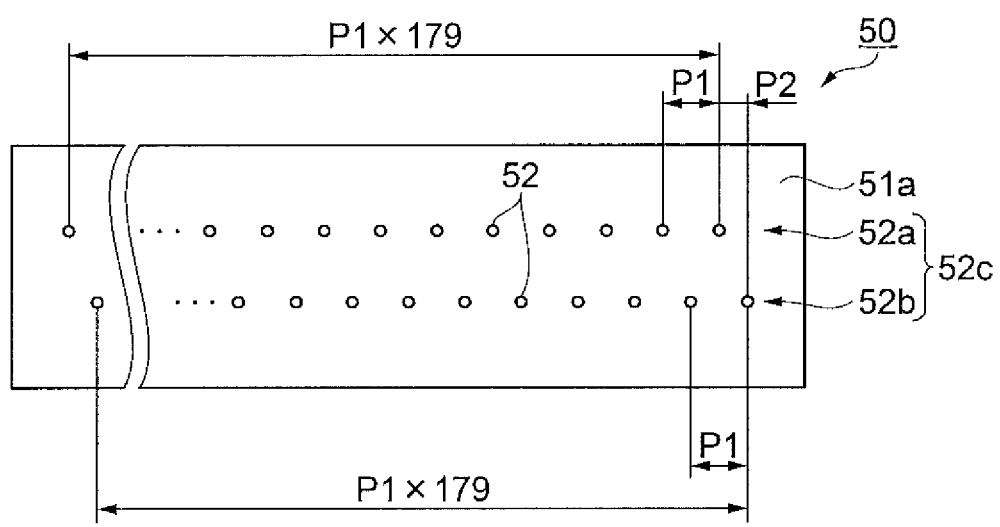
FIG. 3 is a plan view illustrating an arrangement state of a plurality of nozzles on a nozzle surface of the ink jet head.

FIG. 2 is a schematic perspective view illustrating a configuration of the ink jet head. FIG. 3 is a plan view illustrating an arrangement state of a plurality of nozzles on a nozzle surface of the ink jet head.

As illustrated in FIG. 2, the ink jet head 50 serving as the discharge head is a so-called double type, and includes a liquid (ink) introduction portion 53 having a double connection needles 54, a head substrate 55 stacked on the introduction portion 53, and a head main body 56 which is disposed on the head substrate 55 and in which a flow path inside the head for the liquid (ink) is internally formed. The connection needle 54 is connected to the above-described ink supply mechanism (not illustrated) via a tube, and supplies the liquid (ink) to the flow path inside the head. A double connector 58 to be connected to a head driver 63 (refer to FIG. 5) serving as a head drive unit via a flexible flat cable (not illustrated) is disposed in the head substrate 55.

The head main body 56 has a pressurizing unit 57 which is configured to have a piezoelectric element serving as a drive unit (actuator) and which has a cavity, and a nozzle plate 51 in which two nozzle rows 52a and 52b are formed parallel to each other on a nozzle surface 51a.

As illustrated in FIG. 3, the two nozzle rows 52a and 52b are arranged on the nozzle surface 51a in a state where the plurality of (for example, 180) nozzles 52 are respectively arranged side by side with a pitch P1 at substantially equal intervals and are shifted from each other with a pitch 22, half of the pitch P1. In the embodiment, for example, the pitch P1 is approximately 141 µm. Accordingly, if the nozzles 52 are viewed in a direction orthogonal to the nozzle rows 52c configured to have the two nozzle rows 52a and 52b, the 360 nozzles 52 are in a state of being arranged with a nozzle pitch of approximately 70.5 µm. The diameter of the nozzle 52 is approximately 27 µm.

In the ink jet head 50, if a drive signal as an electrical signal is applied from the head driver 63 to a piezoelectric element, a volume of the cavity of the pressurizing unit 57 starts to vary, and the liquid (ink) filling the cavity is correspondingly pressurized by a pump operation. In this manner, the liquid (ink) as the droplet can be discharged from the nozzle 52.

In the ink jet head 50, a drive unit (actuator) disposed for each nozzle 52 is not limited to the piezoelectric element. The actuator may be an electromechanical transducer which displaces a diaphragm by using electrostatic attraction, or an electro-thermal transducer which heats the liquid (ink) so as to be discharged as the droplet from the nozzle 52.

Figure 4:
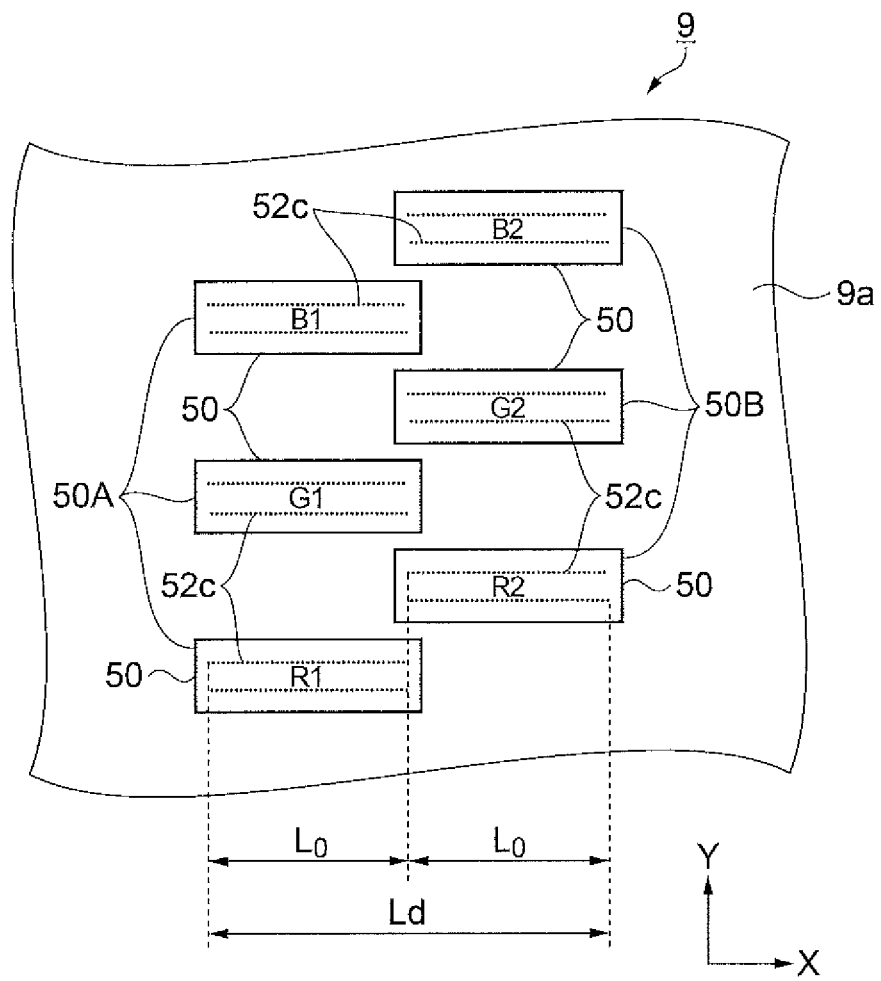
FIG. 4 is a schematic plan view illustrating an arrangement of the ink jet head in a head unit.

FIG. 4 is a schematic plan view illustrating an arrangement of the ink jet head in the head unit. Specifically, FIG. 4 is a view when viewed from a side facing the substrate W.

As illustrated in FIG. 4, the head unit 9 includes the head plate 9a having the plurality of ink jet heads 50 arranged therein. A head group 50A having 3 ink jet heads 50 and a head group 50B similarly having 3 inkjet heads 50, that is, 6 ink jet heads 50 in total are mounted on the head plate 9a. In the embodiment, a head R1 (ink jet head 50) of the head group 50A and a head R2 (ink jet head 50) of the head group 50B discharge the same liquid (ink). The other head G1 and head G2, and the other head B1 and head B2 discharge the same liquid (ink). That is, a configuration is adopted in which 3 different liquids (inks) can be discharged.

A drawing image width which enables one ink jet head 50 to draw an image is set to $L_0$, and the drawing image width is set to be an effective length of the nozzle row 52c. The nozzle row 52c is configured to include 360 nozzles 52.

The head R1 and the head R2 are arranged in parallel in the main scanning direction so that the nozzle rows 52c adjacent to each other when viewed in the main scanning direction (Y-axis direction) are continuous by keeping 1 nozzle pitch in the sub-scanning direction (X-axis direction) orthogonal to the main scanning direction. Therefore, an effective drawing image width Ld of the head R1 and the head R2 which discharge the same liquid (ink) is twice the drawing image width $L_0$. The head G1 and the head G2, and the head B1 and the head B2 are similarly arranged in parallel in the main scanning direction (Y-axis direction).

The nozzle rows 52c disposed in the ink jet head 50 is not limited to the double type, and may be a single type. The arrangement of the ink jet head 50 in the head unit 9 is not limited thereto.

Figure 5:
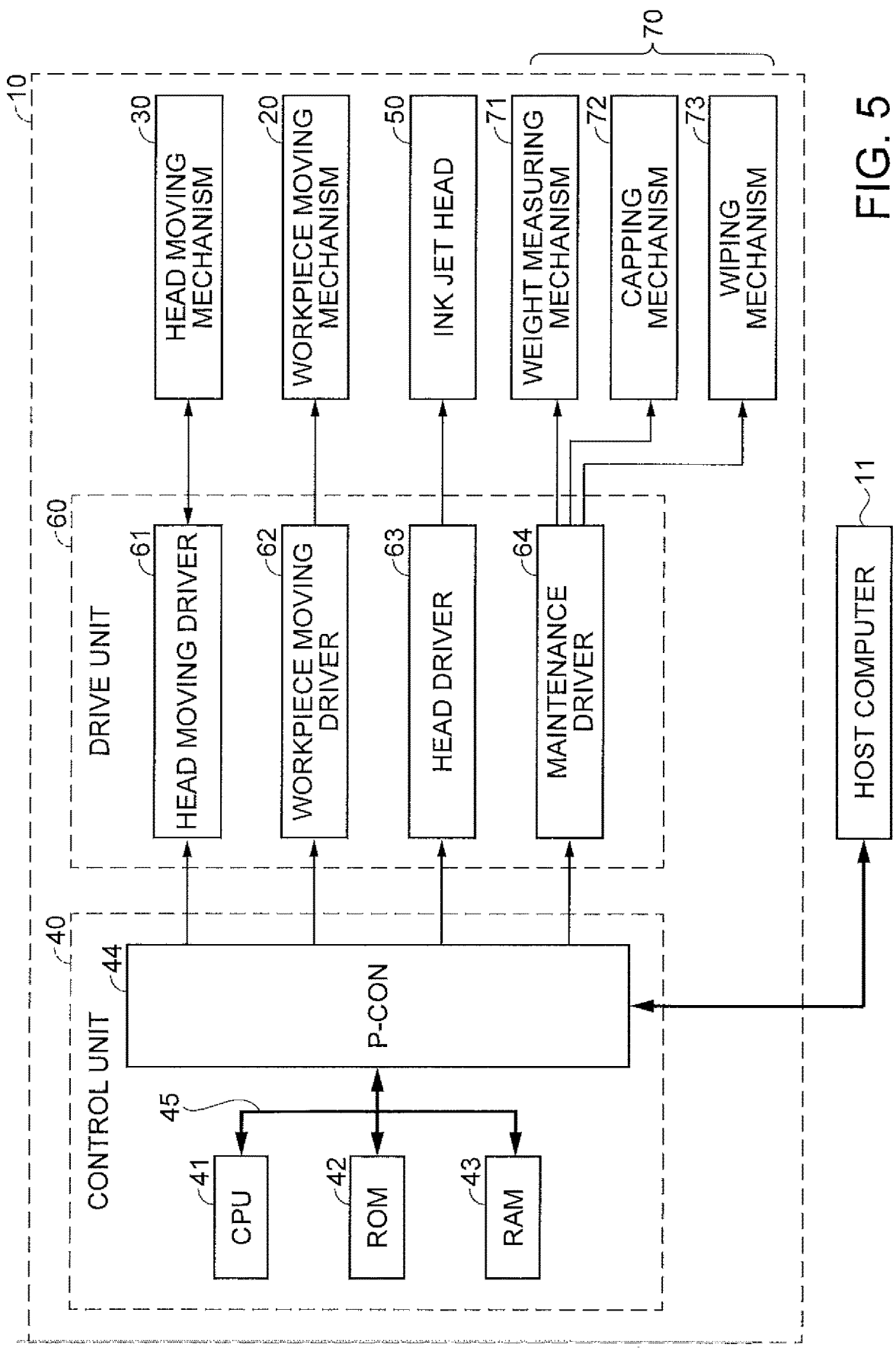
FIG. 5 is a block diagram illustrating electrical and mechanical configurations of the droplet discharge device.

Next, electrical and mechanical configurations and a function of the droplet discharge device 10 will be described with reference to FIG. 5. FIG. 5 is a block diagram illustrating the electrical and mechanical configurations of the droplet discharge device.

As illustrated in FIG. 5, the droplet discharge device 10 includes a drive unit 60 having various drivers for driving the head moving mechanism 30, the workpiece moving mechanism 20, the inkjet head 50, and the maintenance mechanism 70, and the control unit 40 which integrally controls the droplet discharge device 10 including the drive unit 60.

The drive unit 60 includes a head moving driver 61 which drives and controls a linear motor of the head moving mechanism 30, a workpiece moving driver 62 which similarly drives and controls a linear motor of the workpiece moving mechanism 20, a head driver 63 serving as a head drive unit which drives and controls the ink jet head 50, and a maintenance driver 64 which drives and controls the maintenance mechanism 70.

Although not illustrated in FIG. 5, the droplet discharge device 10 includes a linear scale and a scale head which can detect a position of the moving carrier 22 in the workpiece moving mechanism 20 in the main scanning direction (Y-axis direction), and an encoder corresponding to the scale head. The head moving mechanism 30 also includes a linear scale and a scale head which can detect a position of the moving carrier 32 in the sub-scanning direction (X-axis direction), and an encoder corresponding to the scale head. A configuration is adopted in which an encoder pulse periodically generated from these encoders is utilized so as to control each movement of the moving carrier 22 and the moving carrier 32.

The maintenance mechanism 70 is configured to include a weight measuring mechanism 71, for example, such as an electronic balance which measures the weight by receiving the droplet discharged from the nozzle 52 of the ink jet head 50 on a trial basis, a capping mechanism 72 which seals the nozzle surface 51a (refer to FIG. 2) of the ink jet head 50 and performs suction of the liquid (ink) from the nozzle 52 so as to restore the clogged nozzle 52, and a wiping mechanism 73 which causes a wiping member to wipe and clean foreign substances adhering to the nozzle surface 51a. The maintenance driver 64 is configured to include a driver which drives respective mechanisms for performing maintenance on the ink jet head 50. Without being limited thereto, a configuration of the maintenance mechanism 70 may include an imaging mechanism which receives the droplet discharged from the nozzle 52 of the ink jet head 50 by using a discharge target such as a sheet and images a landing state of the droplet so as to detect landing position accuracy of the droplet or clogging.

The control unit 40 includes CPU 41, ROM 42, RAM 43, and P-CON (program controller) 44, and all of these are connected to each other via bus 45. A host computer 11 is connected to the P-CON 44. ROM 42 has a control program region which stores a control program processed in CPU 41 and a control data region which stores control data for performing a drawing image operation or a maintenance process of restoring the function of the ink jet head 50.

RAM 43 has various storage units such as a discharge position data storage unit which stores discharge position data indicating how the discharged droplet is disposed on the substrate W and a position data storage unit which stores position data of the substrate W and the ink jet head 50 (actually, the nozzle row 52c). RAM 43 is used as various work regions for a control process. Various drivers of the drive unit 60 are connected to P-CON 44. A logic circuit which supplements the function of CPU 41 and handles an interface signal of a peripheral circuit is configured and incorporated in P-CON 44. Therefore, P-CON 44 incorporates various commands from the host computer 11 into the bus 45 directly or after processing the commands. In conjunction with CPU 41, P-CON 44 outputs data or a control signal output from CPU 41 to the bus 45, to the drive unit 60 directly or after processing the data or the control signal.

CPU 41 inputs various detection signals, various commands, and various data items via P-CON 44 in accordance with a control program in ROM 42, and processes various data items in RAM 43. Thereafter, CPU 41 outputs various control signals to the drive unit 60 via P-CON 44, thereby controlling the overall droplet discharge device 10. For example, CPU 41 controls the ink jet head 50, the workpiece moving mechanism 20, and the head moving mechanism 30, and disposes the head unit 9 and the substrate W so as to face each other. In synchronization with the relative movement between the head unit 9 and the substrate W (stage 5), CPU 41 transmits a control signal to the head driver 63 so as to discharge the liquid (ink) as the droplet to the substrate W from the plurality of nozzles 52 of each ink jet head 50 mounted on the head unit 9. In the embodiment, discharging the liquid (ink) in synchronization with the movement of the substrate W in the Y-axis direction is referred to as main scanning, and moving the head unit 9 in the X-axis direction with respect to the main scanning is referred to as subscanning. The droplet discharge device 10 according to the embodiment can discharge the liquid (ink) to the substrate W by combining and repeatedly performing the main scanning and the sub-scanning multiple times. Without being limited to the movement of the substrate W in one direction with respect to the ink jet head 50, the main scanning can also be performed by causing the substrate W to reciprocate.

The encoder disposed in the workpiece moving mechanism 20 generates an encoder pulse in response to the main scanning. In the main scanning, the moving carrier 22 is moved at a predetermined moving speed. Accordingly, the encoder pulse is periodically generated.

For example, if the moving speed of the moving carrier 22 in the main scanning is set to 200 mm/sec and a drive frequency (in other words, discharge timing in a case where the droplet is continuously discharged) for driving the ink jet head 50 is set to 20 kHz, discharge resolution of the droplet in the main scanning direction can be obtained in such a way that the movement speed is divided by the drive frequency. Accordingly, the discharge resolution is 10 µm. That is, the droplet can be disposed with a pitch of 10 µm on the substrate W. If the moving speed of the moving carrier 22 is set to 20 mm/sec, the droplet can be disposed with a pitch of 1 µm on the substrate W. The actual discharge timing of the droplet is determined, based on discharge control data generated by counting the encoder pulses which are periodically generated. The minimum arrangement pitch of the droplet on the substrate W in this main scanning is called the discharge resolution.

The host computer 11 transmits control information such as a control program and control data to the droplet discharge device 10. The host computer 11 has a function as an arrangement information generation unit which generates arrangement information as discharge control data for arranging the liquid (ink) as the droplet on the substrate W. The arrangement information is represented as a bitmap, for example, by representing discharge position data indicating an arrangement position of the droplet on the substrate W, discharge data indicating the number of arrangements of the droplet (in other words, the number of droplets discharged from each nozzle 52), and information relating to ON/OFF states of the plurality of nozzles 52 in the main scanning, that is, whether or not to select the nozzle 52. The host computer not only can generate the above-described arrangement information, but also can correct the above-described arrangement information which is temporarily stored in RAM 43.

The discharge position data indicating the arrangement position of the droplet on the substrate W indicates a relative position between the substrate W and the nozzle 52 in the main scanning. As described above, the substrate W is mounted on the stage 5, and is moved in the main scanning direction (Y-axis direction) by the moving carrier 22. The position of the substrate W in the main scanning direction, that is, the position of the stage 5 in the main scanning direction is controlled by counting the encoder pulses which are periodically output from the encoder of the workpiece moving mechanism 20 in the main scanning. The position of the ink jet head 50 with respect to the substrate W, that is, the position of the nozzle 52 in the sub-scanning direction (X-axis direction) is controlled by counting the encoder pulses which are periodically output from the encoder of the head moving mechanism 30. In this manner, based on the discharge position data, the nozzle 52 discharging the droplet and the substrate W are relatively arranged, and the droplet is discharged from the nozzle 52 toward the substrate W.

Droplet Discharge Method

Figure 6:
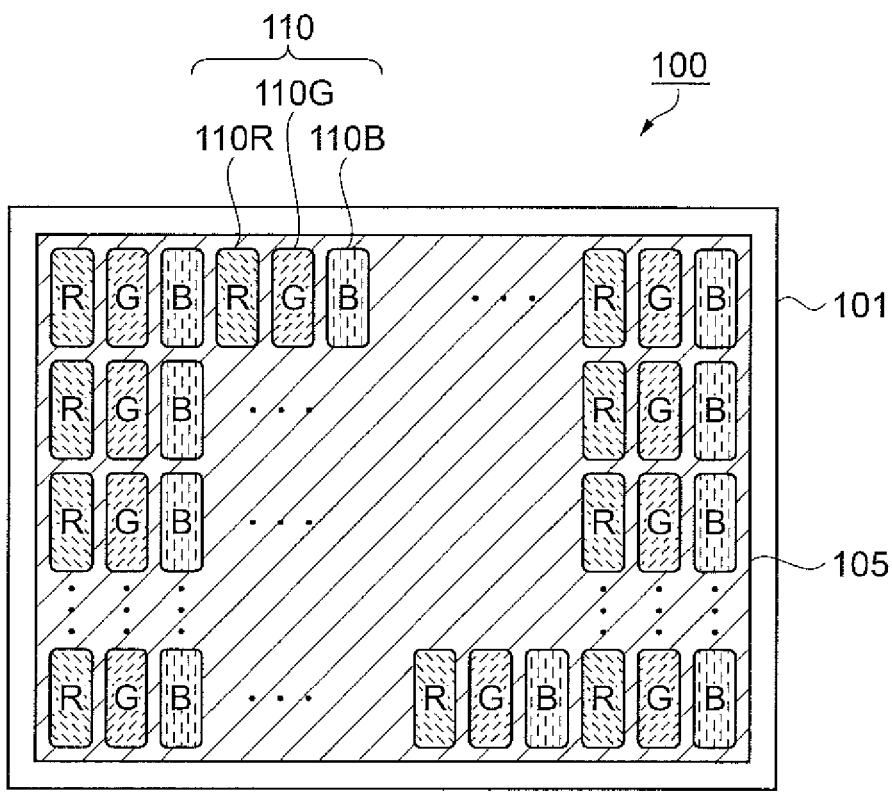
FIG. 6 is a schematic plan view illustrating a configuration of a color filter substrate.
Figure 7:
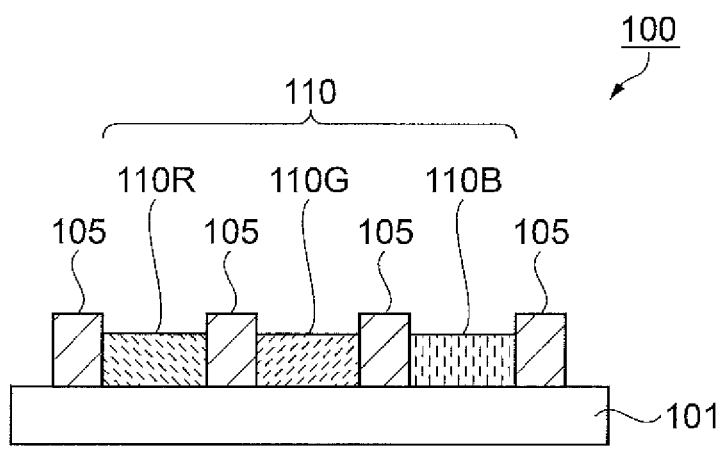
FIG. 7 is a schematic sectional view illustrating a structure of the color filter substrate.
Figure 8:
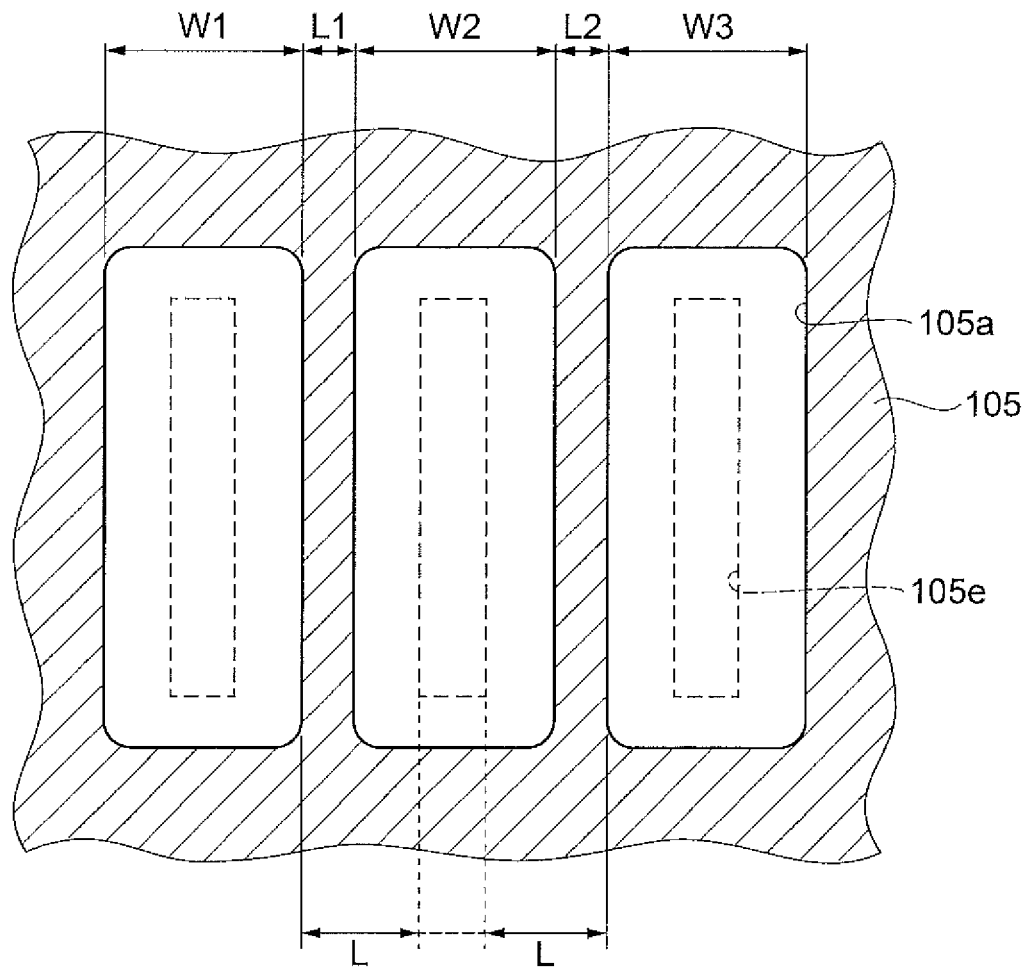
FIG. 8 is a schematic plan view illustrating an arrangement example of an opening and a landing region on a partition wall.
Figure 9:
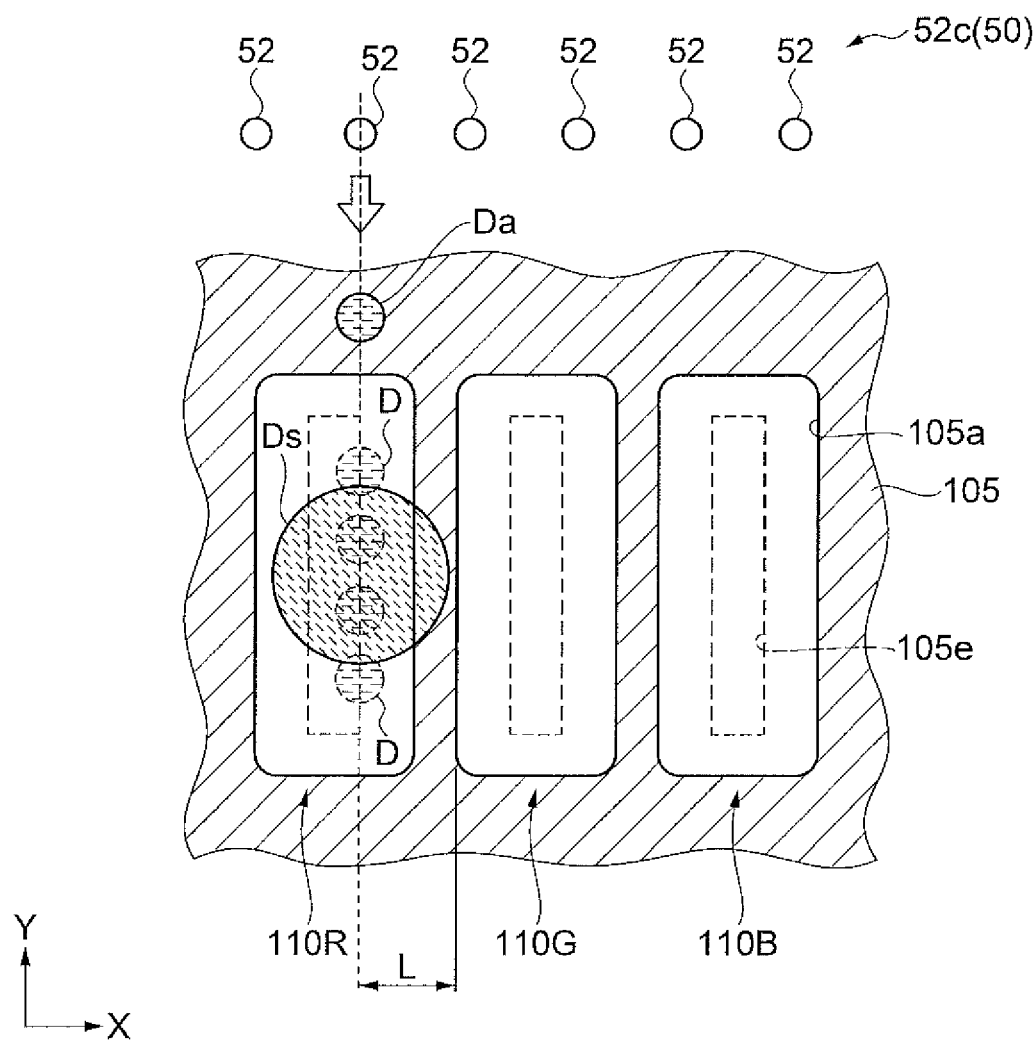
FIG. 9 is a schematic plan view illustrating an example of a landing state of a droplet according to a droplet discharge method.
Figure 10:
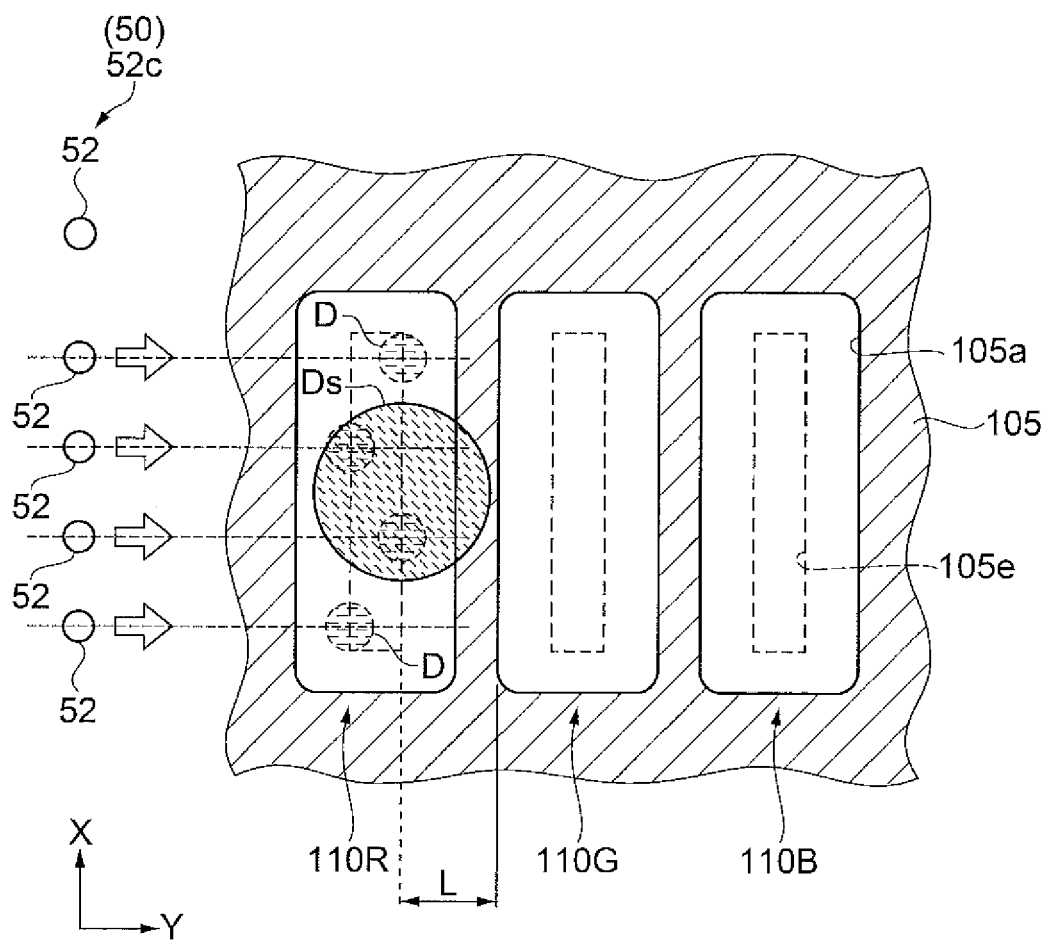
FIG. 10 is a schematic plan view illustrating another example of a landing state of a droplet according to a droplet discharge method.
Figure 11:
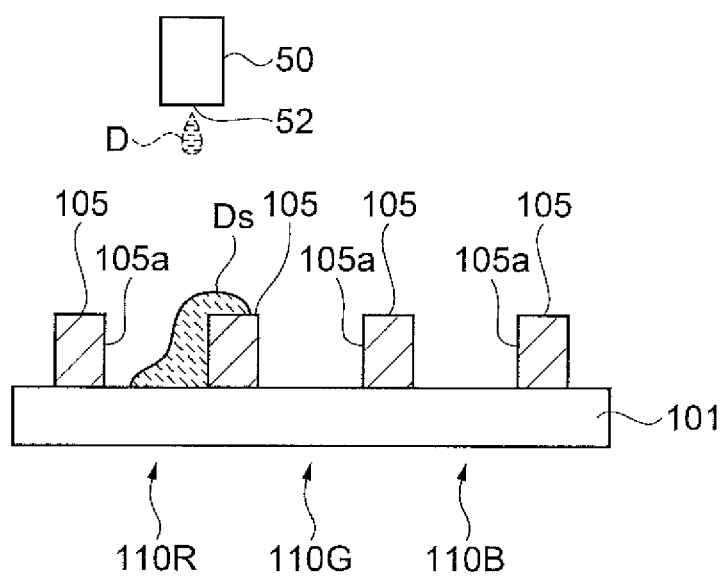
FIG. 11 is a schematic sectional view illustrating a landing state of a droplet according to the droplet discharge method.

Next, an example in which the droplet discharge method according to the present embodiment is applied to a forming method of a color filter will be described with reference to FIGS. 6 and 11. FIG. 6 is a schematic plan view illustrating a configuration of a color filter substrate. FIG. 7 is a schematic sectional view illustrating a structure of the color filter substrate. FIG. 8 is a schematic plan view illustrating an arrangement example of an opening and a landing region on a partition wall. FIG. 9 is a schematic plan view illustrating an example of a landing state of the droplet according to the droplet discharge method. FIG. 10 is a schematic plan view illustrating another example of a landing state of the droplet according to the droplet discharge method. FIG. 11 is a schematic sectional view illustrating a landing state of the droplet according to the droplet discharge method.

As illustrated in FIGS. 6 and 7, a color filter substrate 100 has a light transmitting substrate 101 and a color filter 110 formed on the substrate 101. The color filter 110 is configured to include a colored layer 110R of a red color (R), a colored layer 110G of a green color (G), a colored layer 110B of a blue color (B), and a light-blocking partition wall 105. As illustrated in FIG. 6, the colored layers 110R, 110G, and 110B respectively have a substantially rectangular shape in a plan view, and are respectively formed in a region surrounded with the partition wall 105. The colored layers having the same color are arranged in a column direction (or a longitudinal direction of the colored layer) on the drawing, and the colored layers 110R, 110G, and 110B having each different color are arranged in a row direction (or a short direction of the colored layer) on the drawing. This arrangement sequence of the colored layers 110R, 110G, and 110B is called a stripe method. In a display device, for example, such as a liquid crystal display device which uses the color filter substrate 100, the colored layers 110R, 110G, and 110B of three colors are treated as one display pixel unit. The arrangement of the colored layers respectively having different colors in the display pixel unit according to the stripe method is not limited to the order of R, G, and B. For example, the order of B, G, and R may be employed, or the order of G, B, and R may be employed.

As illustrated in FIG. 7, the film thickness of the colored layers 110R, 110G, and 110B on the substrate 101 is 1.0 µm to 2.0 µm, for example. In contrast, the height (film thickness) of the partition wall 105 on the substrate 101 is greater than the film thickness of the colored layers 110R, 110G, and 110B. For example, this forming method of the partition wall 105 can include a method of forming a resin containing a light-blocking material so as to have a predetermined pattern shape by using a printing method such as an offset method, or a photolithography method in which a photosensitive resin containing a light-blocking pigment is applied by using a spin coating method or a roll coating method so as to form a coated film, and in which the coated film is exposed and developed so as to have a desired pattern shape.

On the other hand, according to the forming method of the colored layers 110R, 110G, and 110B, the above-described droplet discharge device 10 is used so that a region surrounded with the partition wall 105 is coated with the liquid containing a color material from the nozzle 52 of the ink jet head 50, and the applied liquid is dried and solidified so as to form the colored layers 110R, 110G, and 110B. The amount of the liquid applied to the region surrounded with the partition wall 105 is adjusted. In this manner, the respective film thicknesses of the colored layers 110R, 110G, and 110B can be substantially equal to each other. The film thickness of one colored layer can also be different from the film thickness of the other colored layer. The respective film thicknesses of the colored layers 110R, 110G, and 110B are adjusted. In this manner, it is possible to adjust optical characteristics such as light transmittance, color reproducibility, and color balance in the color filter 110. Compared to a case where the colored layers 110R, 110G, and 110B are formed by using the photolithography method, the droplet discharge method is superior in that it is possible to relatively easily adjust the respective film thicknesses of the colored layers 110R, 110G, and 110B, that is, the optical characteristics.

Next, the arrangement example of the opening and the landing region of the partition wall 105 to which the liquid containing the color material is discharged by using the droplet discharge method will be described with reference to FIG. 8.

As illustrated in FIG. 8, an opening 105a having a substantially rectangular shape in a plan view is formed on the light-blocking partition wall 105. The liquid containing the color material is applied to the opening 105a, thereby forming the colored layer. Corner portions of the opening 105a have an arc shape so that the applied liquid evenly spreads in the opening 105a. The planar shape of the opening 105a is not limited thereto, and the short side may have an arc shape.

In FIG. 8, in order to facilitate the description, the openings 105a arranged from the left side to the right side are referred to as a first opening, a second opening, and a third opening (similar in FIGS. 9 and 10). The width of the first opening is set to W1, the width of the second opening is set to W2, and the width of the third opening is set to W3. The width of the partition wall 105 between the first opening and the second opening is set to L1, and the width of the partition wall 105 between the second opening and the third opening is set to L2. The arrangement example of the opening 105a illustrated in FIG. 8 shows W1=W2=W3, and L1=L2. That is, the openings 105a having a constant width in the short direction are arranged at equal intervals in the short direction.

In each of the plurality of openings 105a, a landing region 105e on which the droplet of the liquid is caused to land has a rectangular shape illustrated by a broken line. If attention is paid to the second opening located at the center in FIG. 8, one end portion in the short direction of the landing region 105e is set at a predetermined distance L from an end portion on the second opening side of the third opening adjacent to the right side of the second opening. In addition, the other end portion in the short direction of the landing region 105e is set at the predetermined distance L from an end portion on the second opening side of the first opening adjacent to the left side of the second opening (region setting step). That is, in the embodiment, the openings 105a having the same size are arranged in the short direction. Accordingly, the respective positions in the short direction of the landing region 105e in the respective openings 105a are the same as each other, and the landing region 105e is located at the central portion in the short direction of the respective openings 105a. Similarly to the short direction, the position of the landing region 105e in the longitudinal direction of the respective openings 105a may be set at the predetermined distance from an end portion of the opening 105a adjacent to opening 105a in the longitudinal direction. The colored layers having the same color are formed in the opening 105a adjacent in the longitudinal direction. Accordingly, the position in the longitudinal direction of the landing region 105e in the opening 105a does not need to be strictly set, compared to the position in the short direction.

The droplet discharge method according to the embodiment is performed by using the above-described droplet discharge device 10. A specific method of causing the droplet to land will be first described with reference to an example illustrated in FIG. 9.

As illustrated in FIG. 9, in this example, the colored layer 110R is formed in the first opening on the left side of the openings 105a arranged in the short direction. In the droplet discharge device 10, the substrate 101 having the partition wall 105 formed therein is arranged with respect to the ink jet head 50 so that the arrangement direction of the plurality of nozzles 52 of the nozzle row 52 extends along the short direction of the openings 105a. That is, the substrate 101 is arranged so that the longitudinal direction of the openings 105a extends in the Y-axis direction (main scanning direction) Performing the main scanning (discharge step) for discharging the droplet from the nozzle 52 selected by arranging the nozzle row 52c along the sub-scanning direction (X-axis direction) in this way, to the openings 105a arranged so that the longitudinal direction is coincident with the main scanning direction (Y-axis direction), that is, drawing an image for applying the droplet to a predetermined range is called the vertical drawing image. Without being limited to the direction along the sub-scanning direction (X-axis direction), the arrangement of the nozzle row 52c in the vertical drawing image may be in a direction obliquely intersecting the main scanning direction (Y-axis direction). If the nozzle row 52c is obliquely tilted in the main scanning direction, a substantial arrangement interval of the nozzles 52 can be decreased when viewed in the main scanning direction. In other words, an interval which can arrange a droplet D can be decreased in the sub-scanning direction (X-axis direction) in the main scanning.

The landing region 105e of the first opening where the colored layer 110R is to be formed includes the above-described discharge position data as a bitmap. The liquid containing a red (R) color material as the droplet D is discharged from the nozzle 52 so as to land in the landing region 105e which is set at the predetermined distance L from an end portion of the adjacent second opening where the colored layer 110G is to be formed. While the ink jet head 50 and the substrate 101 are relatively moved in the main scanning direction (direction indicated by an arrow in FIG. 9), a predetermined number of droplets D is discharged from the nozzle 52 so as to land in the landing region 105e at intervals based on discharge resolution. As described above, the discharge resolution is determined in a unit of μm (micrometer). Accordingly, as illustrated in FIG. 9, if a plurality of droplets D are caused to continuously land in the Y-axis direction, a landing interval (time and distance) of the droplets D is short. Accordingly, the droplets D are combined with each other, and thus, are likely to become one big droplet Ds.

FIG. 9 illustrates an example in which 4 droplets D are discharged to the landing region 105e from one nozzle 52 by single main scanning. However, the number of discharged droplets D is not limited thereto. The amount of the liquid applied to the first opening is determined depending on an area of the first opening, the film thickness of the colored layer 110R, and the concentration of solid content including the color material contained in the liquid. The number of discharged droplets D landing in the landing region 105e by single main scanning is determined depending on the amount of the liquid. In a case of the vertical drawing image, although it depends on the interval of the nozzles 52 and the width of the opening 105a when viewed in the main scanning direction, the number of nozzles 52 used for the opening 105a in single main scanning is one or two as illustrated in FIG. 9. In the single main scanning, the nozzle 52 is not always used at a proper position for all of the openings 105a where the colored layer 110R of the red color (R) is formed on the substrate 101. Accordingly, the main scanning is performed again after the sub-scanning is performed by relatively shifting the position of the nozzle 52 from the substrate 101.

The landing region 105e according to the embodiment is set, based on a technical concept that the center of the droplet D discharged from the nozzle 52 includes the droplet D landing in an end portion of the landing region 105e in the X-axis direction. Therefore, as illustrated in FIG. 9, in a case of the plurality of droplets D land on one end portion in the X-axis direction of the landing region 105e by the single main scanning, the droplet Ds whose landing diameter increases after the droplets D are combined with each other rides on the partition wall 105 between the first opening and the second opening, thereby causing a possibility that the droplet Ds may leak to the second opening. The maximum diameter of the droplet Ds can be defined as the landing diameter of the plurality of discharged droplets D. As disclosed in JP-A-2004-361491 or JP-A-2011-189267 described above, according to the method of positioning the landing region 105e with reference to an end portion in the X-axis direction of the opening 105a to which the droplet D is discharged, it is difficult to prevent this leakage of the droplet Ds. The reason is that the related art does not sufficiently consider the landing diameter of the plurality of landing droplets D.

In the droplet discharge method according to the embodiment, even if the plurality of droplets D land in one end portion of the landing region 105e, in order to prevent the droplet Ds having the plurality of droplets D combined with each other from leaking to the second opening adjacent to the first opening, one end portion is set in the short direction of the landing region 105e at the predetermined distance L from an end portion on the first opening side of the second opening adjacent to the right side of the first opening.

Therefore, it is preferable that the predetermined distance L is greater than a value obtained by adding a value of a landing position error in the droplet discharge device 10 to a half value (radius of the droplet Ds) of the maximum diameter of the droplet Ds in which the plurality of droplets D landed by the single main scanning can be combined with each other. Similarly to one end portion described above, the other end portion in the X-axis direction of the landing region 105e of the first opening is also set using the above-described predetermined distance L (region setting step).

The droplet D is discharged from the nozzle 52 at predetermined discharge timing so as to land at a target landing position set in the bitmap (discharge position data) in the main scanning. The landing position error is obtained as a position deviation amount of the actual landing position with respect to the target landing position. It is desirable to acquire the landing position error (landing position deviation amount) in advance through test discharge using the maintenance mechanism 70. The landing position error may be evaluated, based on the landing position deviation amount in one nozzle 52 out of the plurality of nozzles 52 provided for the ink jet head 50, or the average value, the maximum value, the minimum value, or the standard deviation of the landing position deviation amounts obtained from the test discharge results multiple times in the nozzle 52. In addition, the landing position error may be evaluated, based on the average value, the maximum value, the minimum value, or the standard deviation of the landing position deviation amounts of the plurality of nozzles 52. Alternatively, the landing position error may be evaluated, based on the average value, the maximum value, the minimum value, or the standard deviation of the landing position deviation amounts obtained from the test discharge results multiple times in the plurality of nozzles 52.

When the predetermined distance L is determined, it is difficult to accurately measure the maximum diameter of the droplet Ds in a state where the droplet Ds partially rides on the partition wall 105. Therefore, according to the embodiment, a dummy droplet Da is discharged onto the partition wall 105 so as to measure a position of the dummy droplet Da. In this manner, it is possible to accurately estimate a central position of the droplet D landing in the landing region 105e. In addition, if the droplets D which are the same number of droplets D caused to land in the landing region 105e are discharged onto the partition wall 105 so as to form the dummy droplet Da and the maximum diameter of the dummy droplet Da is measured, it is possible to easily and accurately estimate the maximum diameter of the droplet Ds.

In the example of the above-described droplet discharge method, the sub-scanning direction (X-axis direction) corresponds to a first direction according to the invention, and the main scanning direction (Y-axis direction) corresponds to a second direction according to the invention. The substrate 101 is an example of a base according to the invention.

Next, a way of causing another droplet to land in the droplet discharge method according to the embodiment will be described with reference to FIG. 10.

As illustrated in FIG. 10, in this example, the substrate 101 having the partition wall 105 formed therein is arranged for the ink jet head 50 in the droplet discharge device 10 so that the arrangement direction of the plurality of nozzles 52 of the nozzle row 52 extends along the longitudinal direction of the opening 105*a*. That is, the substrate 101 is arranged so that the short direction of the opening 105*a* extends along the Y-axis direction (main scanning direction). Performing the main scanning (discharge step) for discharging the droplet D from at least two nozzles 52 selected by arranging the nozzle row 52*c* along the sub-scanning direction (X-axis direction) in this way, to the openings 105*a* arranged so that the longitudinal direction is coincident with the sub-scanning direction (X-axis direction) is called a horizontal drawing image in comparison with the previously described vertical drawing image. Without being limited to the direction along the sub-scanning direction (X-axis direction), the arrangement of the nozzle row 52*c* in the horizontal drawing image may be in a direction obliquely intersecting the main scanning direction (Y-axis direction), similarly to the vertical drawing image.

In FIG. 10, the droplets D are discharged one by one from the respective four nozzles 52 used for the landing region 105*e* of the first opening by the single main scanning. In addition, the droplets D are discharged by changing discharge timing in the adjacent nozzle 52. In this manner, the position is shifted in the main scanning direction (Y-axis direction) of the droplet D which lands adjacent to the droplet D landing in the sub-scanning direction (X-axis direction) in the landing region 105*e*. That is, since the landing interval between the droplets D is lengthened compared to the vertical drawing image, the droplets D are less likely to be combined with each other. If the number of the combined droplets D is reduced, the landing diameter of the droplet Ds generated by the combination tends to decrease. Therefore, the horizontal drawing image can further shorten the predetermined distance L, compared to the vertical drawing image. In other words, even if the width of the partition wall 105 between the first opening and the second opening is smaller compared to the vertical drawing image, the droplet Ds whose landing diameter increases after being discharged to the first opening is less likely to leak to the second opening.

In the horizontal drawing image, the number of nozzles 52 which discharge the droplet D to the landing region 105*e* is not limited to four, and is at least two as described above. The interval between two nozzles 52 when viewed in the main scanning direction (Y-axis direction) is the landing interval of the droplets D in the sub-scanning direction (X-axis direction), and the landing interval in the sub-scanning direction (X-axis direction) in a case of the horizontal drawing image further increases than that in a case of the vertical drawing image. Accordingly, it is not always necessary to change the discharge timing in the adjacent nozzle 52.

According to the above-described droplet discharge method and a program that causes a computer to perform the droplet discharge method, an end portion of the landing region 105*e* of the opening 105*a* in which the droplet D lands is set at a position located at the predetermined distance L with reference to an end portion of the opening 105*a* adjacent to the opening 105*a*, in view of the landing diameter of the droplet Ds after landing and the landing position error in the droplet discharge device 10 (region setting step). Therefore, as illustrated in FIG. 11, the droplet Ds whose landing diameter increases after the plurality of droplets D are discharged from at least one nozzle 52 of the ink jet head 50 and are caused to land in the first opening does not leak to the second opening, even if the droplet Ds rides on the partition wall 105 between the first opening and the second opening. Surface treatment is performed in advance so that the surface of the light-blocking partition wall 105 shows liquid repellency against the liquid, or the partition wall 105 itself is formed using a liquid-repellent material. In this manner, the droplet Ds riding on the partition wall 105 can be accommodated inside the opening 105*a*.

That is, if the color filter 110 is formed using the droplet discharge device 10 and by applying the droplet discharge method according to the embodiment, it is possible to form the color filter 110 with an improved yield by minimizing the color mixture caused by the leakage of the droplet Ds.

In another example of the above-described droplet discharge method, the main scanning direction (Y-axis direction) corresponds to the first direction according to the invention, and the sub-scanning direction (X-axis direction) corresponds to the second direction according to the invention.

Second Embodiment

Figure 12:
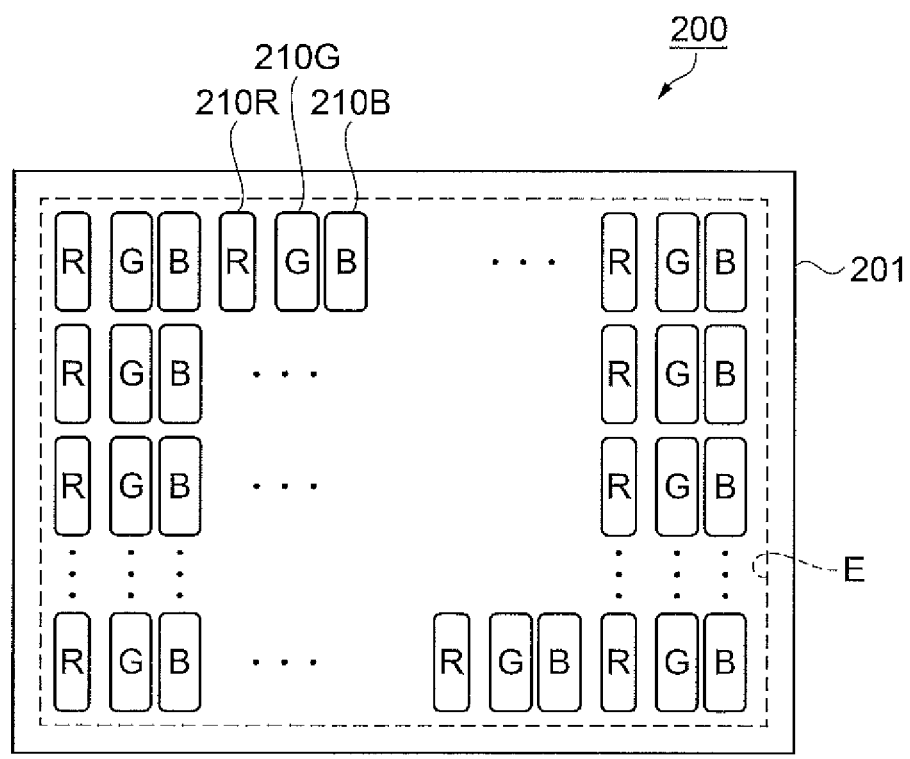
FIG. 12 is a schematic plan view illustrating a configuration example of an organic EL device.
Figure 13:
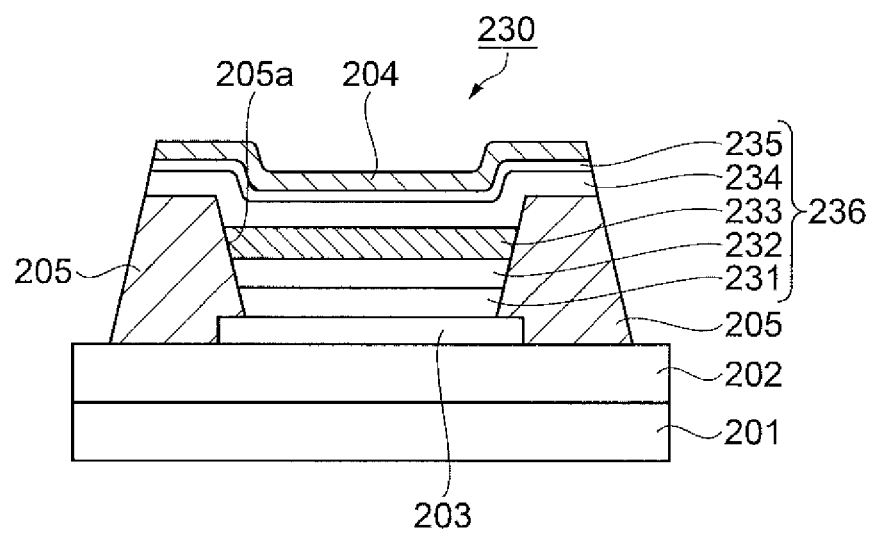
FIG. 13 is a schematic sectional view illustrating a configuration example of an organic EL element.
Figure 14:
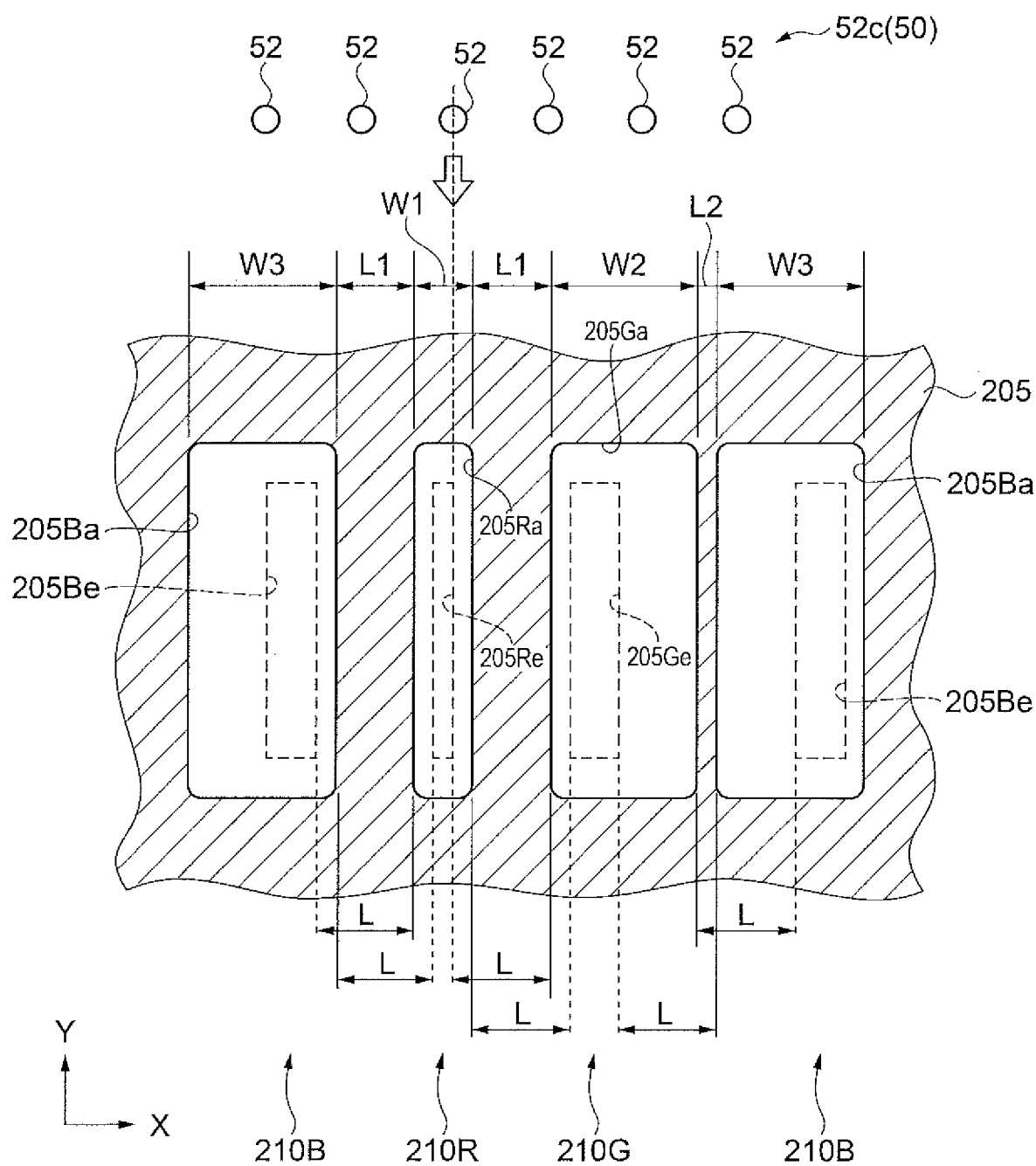
FIG. 14 is a schematic plan view illustrating an arrangement example of an opening and a landing region, which correspond to a sub-pixel of the organic EL device.

Next, an example in which another droplet discharge method according to a second embodiment is applied to a manufacturing method of an organic EL device will be described with reference to FIGS. 12 and 14. FIG. 12 is a schematic plan view illustrating a configuration example of the organic EL device. FIG. 13 is a schematic sectional view illustrating a configuration example of an organic EL element. FIG. 14 is a schematic plan view illustrating an arrangement example of an opening and a landing region, which correspond to a sub-pixel of the organic EL device.

Organic EL Device

As illustrated in FIG. 12, an organic EL device 200 has an element substrate 201 in which sub-pixels 210R, 210G, and 210B capable of emitting red (R), green (G), and blue (B) light (light emitting color) are arranged. The respective sub-pixels 210R, 210G, and 210B have a substantially rectangular shape, and are arranged in a matrix in a display region E of the element substrate 201. Hereinafter, the sub-pixels 210R, 210G, and 210B are collectively referred to as sub-pixels 210 in some cases. In the order of R, G, and B, the sub-pixels 210 having the same light emitting color are arranged in a vertical direction (column direction or the longitudinal direction of the sub-pixels 210) on the drawing, and the sub-pixels 210 respectively having different light emitting colors are arranged in a horizontal direction (row direction or the short direction of the sub-pixels 210) on the drawing. That is, the sub-pixels 210R, 210G, and 210B respectively having different light emitting colors are arranged using a so-called stripe method. A planar shape and arrangement of the sub-pixels 210R, 210G, and 210B are not limited thereto. In addition to a rectangular shape, a substantial rectangular shape includes a square shape whose corner portions are rounded and a square shape whose two facing sides have an arc shape.

An organic EL element which can emit red (R) light is disposed in the sub-pixel 210R. Similarly, an organic EL element which can emit green (G) light is disposed in the sub-pixel 210G, and organic EL element which can emit blue (B) light is disposed in the sub-pixel 210B.

In this organic EL device 200, the three sub-pixels 210R, 210G, and 210B which can respectively obtain different light emitting colors are treated as one display pixel unit, and the respective sub-pixels 210R, 210G, and 210B are electrically controlled. This enables full-color display. In the present embodiment, an area of the sub-pixel 210R which can emit red (R) light is smaller than that of the other sub-pixels 210G and 210B.

An organic EL element 230 illustrated in FIG. 13 is disposed in the respective sub-pixels 210R, 210G, and 210B. As illustrated in FIG. 13, the organic EL element 230 has an insulation film 202 disposed on the element substrate 201, a pixel electrode 203 and a counter electrode 204 which function as a pair of electrodes, and a functional layer 236 disposed between the pixel electrode 203 and the counter electrode 204 and including a luminous layer 233.

The pixel electrode 203 functions as an anode, is disposed for each of the sub-pixels 210R, 210G, and 210B, and is formed using a transparent conductive film such as indium tin oxide (ITO), for example.

For example, the insulation film 202 is formed using silicon oxide, silicon nitride, or silicon oxynitride.

The functional layer 236 is formed in such a way that a hole filling layer 231, a hole transport layer 232, the luminous layer 233, an electron transport layer 234, and an electron filling layer 235 are sequentially stacked one on another from the pixel electrode 203 side. In particular, a configuration material of the luminous layer 233 is selected in accordance with the light emitting color. However, herein, regardless of the light emitting color, the layers are collectively referred to as the luminous layer 233. Without being limited thereto, a configuration of the functional layer 236 may include an intermediate layer which controls the movement of charges (carriers; holes or electrons), in addition to the above-described layers.

The counter electrode 204 functions as a cathode, is disposed as a common electrode common to the sub-pixels 210R, 210G, and 210B, and is formed using an alloy of aluminum (Al) or silver (Ag) and magnesium (Mg).

The hole as a carrier fills the luminous layer 233 from the pixel electrode 203 side as an anode, and the electron as a carrier fills the luminous layer 233 from the counter electrode 204 side as a cathode. The hole and the electron filling the luminous layer 233 form an exciton (state where the hole and the electron are bound to each other by the Coulomb force). When the exciton disappears (when the hole and the electron are recombined with each other), energy is partially released as fluorescence or phosphorescence.

In the organic EL device 200, if the counter electrode 204 is configured to be light-reflective, it is possible to employ a bottom emission type in which light emitted from the luminous layer 233 is extracted from the element substrate 201 side. In addition, if a light-reflective layer is disposed between the pixel electrode 203 and the element substrate 201 or the pixel electrode 203 is configured to be light-reflective and the counter electrode 204 is configured to be light-transmittable, it is possible to employ a top emission type in which the light emitted from the luminous layer 233 is extracted from the counter electrode 204 side. In the embodiment, on the assumption that the organic EL device 200 employs the bottom emission type, description will be made hereinafter. The organic EL device 200 is an active drive type in which the element substrate 201 is provided with pixel circuits which can respectively and independently drive organic EL elements 230 for each of the sub-pixels 210R, 210G, and 210B. The pixel circuit can employ a known configuration, and thus, the illustration of the pixel circuit is omitted in FIG. 13.

The organic EL device 200 has a partition wall 205 which overlaps an outer edge of the pixel electrode 203 in the organic EL element 230 for each of the sub-pixels 210R, 210G, and 210B, and which configures an opening 205a on the pixel electrode 203.

The organic EL element 230 is formed with the droplet discharge method using the hole filling layer 231, the hole transport layer 232, the luminous layer 233 which configure the functional layer 236. The liquid (ink) containing a component configuring each layer and a solvent is applied to the opening 205a as a film forming region surrounded with the partition wall 205, and is dried and calcined, thereby forming each layer. In order to form each layer so as to have a desired film thickness, it is necessary to apply a predetermined amount of the liquid (ink) to the opening 205a in quantitatively and positionally accurate manners.

Especially, in the organic EL device 200 according to the embodiment, compared to the organic EL element which can emit red (R) color light, the organic EL element which can emit green (G) or blue (B) color light has a shorter light emitting lifetime. Accordingly, a flowing current amount per unit area is changed to be different. In this manner, a difference in the light emitting lifetime is prevented from being generated between the organic EL elements which emit different color light. That is, an area of the sub-pixel 210R which can emit the red (R) color light is set to be smaller than those of the other sub-pixels 210G and 210B. This adjustment of the sub-pixel 210 is also applied to a case of different light emitting luminance obtained under a constant drive condition between the organic EL elements which emit different color light. That is, the area is adjusted so that predetermined light emitting luminance and a predetermined light emitting lifetime can be obtained for each of the sub-pixels 210R, 210G, and 210B.

Another Droplet Discharge Method

In another droplet discharge method according to the embodiment, as illustrated in FIG. 14, in the sub-pixel 210R having the smallest area among the sub-pixels 210R, 210G, and 210B, one end portion of a landing region 205Re is set at the predetermined distance L on an opening 205Ra from an end portion of an opening 205Ga adjacent in the X-axis direction of the opening 205Ra disposed on the partition wall 205. In addition, the other end portion of the landing region 205Re is set at the predetermined distance L on the opening 205Ra from an end portion of an opening 205Ba adjacent in the X-axis direction of the opening 205Ra. Similarly, one end portion of a landing region 205Ge is set at the predetermined distance L on an opening 205Ga from an end portion of the opening 205Ba adjacent in the X-axis direction of the opening 205Ga. In addition, the other end portion of the landing region 205Ge is set at the predetermined distance L on the opening 205Ga from an end portion of the opening 205Ra adjacent in the X-axis direction of the opening 205Ga. One end portion of a landing region 205Be is set at the predetermined distance L on the opening 205Ba from an end portion of the opening 205Ra adjacent in the X-axis direction of the opening 205Ba. In addition, the other end portion of the landing region 205Be is set at the predetermined distance L on the opening 205Ba from an end portion of the opening 205Ga adjacent in the X-axis direction of the opening 205Ba.

In this case, in the X-axis direction, if the width of the opening 205Ra is set to W1, the width of the opening 205Ga is set to W2, and the width of the opening 205Ba is set to W3, a relationship of W1<W2≤W3 is satisfied. In the X-axis direction, if the width of the partition wall 205 between the opening 205Ra and the opening 205Ga is set to L1 and the width of the partition wall 205 between the opening 205Oa and the opening 205Ba is set to L2, a relationship of L1>L2 is satisfied. Furthermore, in view of the landing diameter of the plurality of landing droplets, the predetermined distance L is set to be greater than a value obtained by adding the landing position error in the droplet discharge device 10 to a half value of the maximum diameter when the droplets land. In this manner, the landing region 205Re of the opening 205Ra having the smallest are is located in a central portion of the opening 205Ra in the X-axis direction. The landing region 205Ge of the opening 205Ga having the larger area than the opening 205Ra is located on the opening 205Ra side rather than the central portion of the opening 205Ga in the X-axis direction. The landing region 205Be of the opening 205Ba having the larger area than the opening 205Ra is located on the opening 205Ra side rather than the central portion of the opening 205Ba in the X-axis direction. Similarly to the above-described color filter substrate 100, the position of the landing region in the longitudinal direction of each opening may also be set at the predetermined distance from an end portion of the opening adjacent to the opening in the longitudinal direction, similarly to the short direction. The organic EL element which can emit the same color light is formed in the opening adjacent in the longitudinal direction. Accordingly, it is not necessary to strictly set the position in the longitudinal direction of the landing region in the opening, compared to the position in the short direction. The above-described process corresponds to a region setting step in the droplet discharge method according to the invention.

For example, as illustrated in FIG. 14, for the ink jet head 50 arranged so that the nozzle row 52c having the plurality of nozzles 52 extends along the sub-scanning direction (X-axis direction), the element substrate 201 is arranged so that the longitudinal direction of the opening 205Ra, 205Ga, and 205Ba extends along the main scanning direction (Y-axis direction). In this manner, the main scanning (vertical drawing image) for discharging the droplets is performed by arranging the element substrate 201 (discharge step). In this case, even if the plurality of droplets discharged from the nozzle 52 used for the opening 205Ra having the smallest area in the main scanning are caused to land in one end portion of the landing region 205Re, the droplet whose landing diameter increases after the droplet lands in the landing region 205Re does not leak to the adjacent opening 205Ga or the adjacent opening 205Ba. Similarly, even if the droplet lands in the other end portion of the landing region 205Ge of the opening 205Ga, the droplet whose landing diameter increases in the opening 205Ga does not leak to the opening 205Ra having the smaller area than the opening 205Ga. Even if the droplet lands in one end portion of the landing region 205Be of the opening 205Ba, the droplet whose landing diameter increases in the opening 205Ba does not leak to the opening 205Ra having the smaller area than the opening 205Ba. In addition, even if the droplet lands in the other end portion of the landing region 205Be of the opening 205Ba, the droplet whose landing diameter increases in the opening 205Ba does not leak to the opening 205Ga having the same area as or the smaller area than the opening 205Ba.

According to the droplet discharge method in the embodiment, the program that causes a computer to perform the droplet discharge method, and the manufacturing method of the organic EL device 200 to which the droplet discharge method is applied, the liquid containing the functional layer forming material is discharged as the droplet to each landing region of the openings 205Ra, 205Ga, and 205Ba which correspond to the sub-pixels 210R, 210G, and 210B, and does not leak to the adjacent opening. Therefore, if the applied liquid is dried and calcined, the functional layer having a desired film thickness can be obtained in each of the openings 205Ra, 205Ga, and 205Ba. The liquids which can emit different color light and which contain a luminous layer forming material are not mixed with each other in the openings 205Ra, 205Ga, and 205Ba. Accordingly, it is possible to obtain desired color emitting from the respective sub-pixels 210R, 210G, and 210B. That is, it is possible to manufacture the organic EL device 200 with an improved yield.

The droplet discharge method according to the embodiment can be applied to the main scanning method of discharging the droplet, even in a case of the horizontal drawing image without being limited to the vertical drawing image. In the droplet discharge method according to the above-described second embodiment, the sub-scanning direction (X-axis direction) corresponds to the first direction according to the invention, and the main scanning direction (Y-axis direction) corresponds to the second direction according to the invention. The element substrate 201 is an example of the base according to the invention.

Without being limited to the above-described embodiments, the invention can be appropriately modified without departing from the gist or the spirit of the invention disclosed in the appended claims and the whole description herein. A modified droplet discharge method, a modified program, and a manufacturing method of an electro-optical device to which the droplet discharge method is applied can also be included in the technical scope of the invention. It is conceivable to adopt various modification examples in addition to the above-described embodiments. Hereinafter, the modification examples will be described as an example.

Modification Example 1

The color filter 110 which employs the droplet discharge method according to the above-described first embodiment is not limited to a configuration in which the colored layer 110R, 110G, and 110B of three colors are arranged in a stripe shape. For example, a yellow (Y) colored layer may be provided in addition to red (R), green (G), and blue (B).

Modification Example 2

The forming method of the color filter 110 according to the first embodiment may employ the droplet discharge method according to the above-described second embodiment. That is, the area of at least one colored layer among the colored layer 110R, 110G, and 110B may be changed to be different from the area of the other colored layer. If the area of the colored layer is changed to be different, it is possible to adjust optical characteristics such as light transmittance, white balance, and color reproducibility in the color filter 110.

Modification Example 3

The droplet discharge method according to the second embodiment is not limitedly applied to a configuration of forming the functional layer of the organic EL elements 230 which can respectively emit different color light in the sub-pixels 210R, 210G, and 210B. For example, the organic EL device 200 may be configured in such a way that the organic EL elements which can respectively emit white color light in the sub-pixels 210R, 210G, and 210B are formed in the element substrate 201, and that the element substrate 201 is arranged to face the color filter substrate 100 having the color filter 110 in which the area of at least one colored layer among the colored layer 110R, 110G, and 110B is changed to be different from the area of the other colored layer.

The entire disclosure of Japanese patent No. 2015-166483, filed Aug. 26, 2015 is expressly incorporated by reference herein.

What is claimed is:

1. A droplet discharge method comprising:
providing a base having a first opening and a second opening positioned adjacent to the first opening along a first direction, the first opening and the second opening having a first partition wall having a first width therebetween, and a third opening positioned adjacent to the second opening along the first direction, the second opening and the third opening having a second partition wall having a second width different from the first width, therebetween;
defining a landing region of the second opening as having a first end portion positioned adjacent the third opening and a second end portion opposite to the first end portion positioned adjacent the first opening;
setting a first predetermined distance from the first end portion of the landing region of the second opening to a sidewall of the third opening along the first direction, the sidewall of the third opening forming a portion of the second partition wall;
setting a second predetermined distance from the second end portion of the landing region of the second opening to a sidewall of the first opening along the first direction, the sidewall of the first opening forming a portion of the first partition wall, the first predetermined distance being equal to the second predetermined distance;
positioning the base and a discharge head to face and relatively scanning each other in a second direction orthogonal to the first direction; and
dropping at least one droplet in the landing region from a nozzle of the discharge head,
wherein each of the first predetermined distance and the second predetermined distance is set to be greater than a value obtained by adding a landing position error of the droplet to a value of half the maximum diameter of a droplet that has been dropped and landed in the landing region.

2. The droplet discharge method according to claim 1, wherein,
in the first direction, a width of the first opening is set to W1, a width of the second opening is set to W2, a width of the third opening is set to W3, a width of the first partition wall is set to L1, and a width of the second partition wall is set to L2, and W1<W2≤W3 and L1>L2 are satisfied.

3. A program that causes a computer to execute the droplet discharge method according to claim 2.

4. A manufacturing method of an organic EL device comprising:
performing the droplet discharge method according to claim 2; and
discharging a droplet of a liquid such that at least one layer out of the functional layer is formed including a luminous layer in a plurality of openings adjacent to each other via the first partition wall or second partition wall.

5. A manufacturing method of a color filter comprising:
performing the droplet discharge method according to claim 2; and
discharging a droplet of a liquid such that a colored layer is formed in a plurality of openings adjacent to each other via the first partition wall or second partition wall.

6. The droplet discharge method according to claim 1, wherein
the discharge head has a plurality of nozzles and
the base is disposed such that each longitudinal direction of the first opening, the second opening, and the third opening extends along the second direction, and dropping a plurality of droplets in the landing region from at least one nozzle of the plurality of nozzles.

7. A program that causes a computer to execute the droplet discharge method according to claim 6.

8. A manufacturing method of an organic EL device comprising:
performing the droplet discharge method according to claim 6; and
discharging a droplet of a liquid such that at least one layer out of the functional layer is formed including a luminous layer in a plurality of openings adjacent to each other via the first partition wall or second partition wall.

9. A manufacturing method of a color filter comprising:
performing the droplet discharge method according to claim 6; and
discharging a droplet of a liquid such that a colored layer is formed in a plurality of openings adjacent to each other via the first partition wall or second partition wall.

10. The droplet discharge method according to claim 1, wherein
the discharge head has a plurality of nozzles, and
the discharging step includes moving the discharge head in the first direction and relatively scanning the base which is disposed so that each longitudinal direction of the first opening, the second opening, and the third opening extends along a second direction orthogonal to the first direction, and dropping at least one droplet in the landing region from two or more nozzles of the plurality of nozzles.

11. A program that causes a computer to execute the droplet discharge method according to claim 10.

12. A manufacturing method of an organic EL device comprising:
performing the droplet discharge method according to claim 10; and
discharging a droplet of a liquid such that at least one layer out of the functional layer is formed including a luminous layer in a plurality of openings adjacent to each other via the first partition wall or second partition wall.

13. A manufacturing method of a color filter comprising:
performing the droplet discharge method according to claim 10; and
discharging a droplet of a liquid such that a colored layer is formed in a plurality of openings adjacent to each other via the first partition wall or second partition wall.

14. The droplet discharge method according to claim 1, wherein
upon positioning the base and the discharge head to face and relatively scanning each other, each of the first predetermined distance and the second predetermined distance is set to be greater than a value obtained by adding a landing position error of the droplet to a value of half the maximum diameter of a droplet that has been dropped and landed after the droplets whose number is the same as a number of droplets that have landed in the landing region are discharged onto the first and second partition walls.

15. The droplet discharge method according to claim 1, wherein the dropping includes dropping a dummy droplet on one of either the first partition wall or the second partition wall so as to obtain the maximum diameter with respect to the center of the dummy droplet.

16. The droplet discharge method according to claim 1, wherein the landing region is set so that the center of the droplet that has been dropped and landed is located at the first end portion of the landing region.

17. A program that causes a computer to execute the droplet discharge method according to claim 1.

18. A manufacturing method of an organic EL device comprising:
   performing the droplet discharge method according to claim 1; and
   discharging a droplet of a liquid such that at least one layer out of the functional layer is formed including a luminous layer in a plurality of openings adjacent to each other via the first partition wall or second partition wall.

19. A manufacturing method of a color filter comprising:
   performing the droplet discharge method according to claim 1; and
   discharging a droplet of a liquid such that a colored layer is formed in a plurality of openings adjacent to each other via the first partition wall or second partition wall.

\* \* \* \* \*